(12) United States Patent
Aliahmad et al.

(10) Patent No.: US 6,291,980 B1
(45) Date of Patent: Sep. 18, 2001

(54) HIGH-RESOLUTION MEASUREMENT OF PHASE SHIFTS IN HIGH FREQUENCY PHASE MODULATORS

(75) Inventors: Mehran Aliahmad, Ottawa; Russell W. Brown, Nepean, both of (CA)

(73) Assignee: Quantum Corporation, Milpitas, CA (US)

( * ) Notice: Subject to any disclaimer, the term of this patent is extended or adjusted under 35 U.S.C. 154(b) by 0 days.

(21) Appl. No.: 09/418,212

(22) Filed: Oct. 13, 1999

(51) Int. Cl.[7] .................. G01R 25/00; H01R 23/12; H01R 23/02; H01R 19/18; H03D 13/00
(52) U.S. Cl. .................. 324/76.82; 324/76.39; 324/76.52; 324/76.53; 324/118
(58) Field of Search .................. 324/76.82, 76.39, 324/76.52, 76.53, 76.77, 118; 331/10, 12, 14, 17, 25, 15, 26

(56) References Cited

U.S. PATENT DOCUMENTS

| | | | | |
|---|---|---|---|---|
| 3,711,773 | * | 1/1973 | Hekimain et al. | 324/76.77 |
| 3,764,902 | * | 10/1973 | Rodine | 324/76.77 |
| 3,886,462 | * | 5/1975 | Okano et al. | 331/12 |
| 4,009,450 | * | 2/1977 | Holcomb et al. | 331/17 |
| 4,024,464 | * | 5/1977 | Underhill et al. | 331/10 |
| 4,418,318 | * | 11/1983 | Swagerty et al. | 327/156 |
| 4,517,531 | * | 5/1985 | Tan et al. | 331/14 |
| 4,815,325 | * | 3/1989 | Tada et al. | 73/861.22 |
| 4,837,853 | * | 6/1989 | Heck | 455/208 |
| 5,019,786 | * | 5/1991 | Fairley et al. | 324/76.77 |
| 5,293,275 | * | 3/1994 | Kawasaki | 360/51 |
| 5,296,820 | * | 3/1994 | Kawabata | 329/307 |
| 5,535,278 | * | 7/1996 | Cahn et al. | 380/274 |
| 5,767,665 | * | 6/1998 | Morita et al. | 324/76.52 |
| 5,831,423 | * | 10/1998 | Mancini | 324/76.77 |
| 5,832,027 | * | 11/1998 | Ishigaki | 375/149 |

* cited by examiner

Primary Examiner—Glenn W. Brown
Assistant Examiner—Wasseem H. Hamdan
(74) Attorney, Agent, or Firm—Pillsbury Winthrop LLP

(57) ABSTRACT

A phase difference to duty-cycle circuit converts a phase shifted signal and a reference signal into a single signal having a duty cycle that is a function of the phase difference between the two signals. The single signal may be further converted to a single direct current (DC) value before being transmitted to external measurement circuitry. The external measurement circuitry, by simply measuring the magnitude of the DC signal, can determine the phase difference between the phase shifted signal and the reference signal. In an alternate embodiment, the phase shift in the target bit of a bit pattern is determined based on measurements of the DC voltage value of the shifted target bit pattern, the DC voltage value of first bit pattern comprising a non-shifted bit pattern representing a zero phase shift of the target bit, and a DC voltage value of a bit pattern comprising a non-shifted bit pattern representing a 100% phase shift of the target bit.

21 Claims, 7 Drawing Sheets

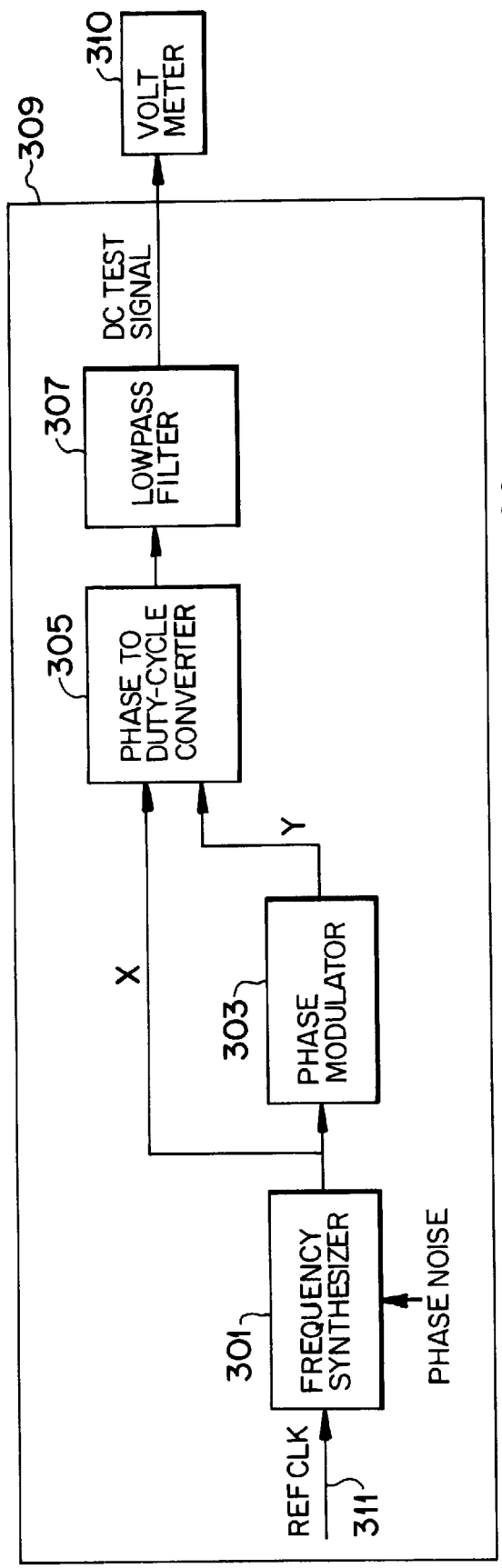

Write Data Pattern

HIGH-RESOLUTION MEASUREMENT OF PHASE SHIFTS IN HIGH FREQUENCY PHASE MODULATORS

BACKGROUND OF THE INVENTION

1. Field of the Invention

Certain aspects of the present invention relate generally to precise timing measurements for integrated circuits. Other aspects relate to the measurement of phase shifts in high frequency phase modulators.

2. Description of Background Information

Phase modulators are devices that modify the phase of an input signal, and may be used, for example, to synchronize the phase of an input signal to that of a local oscillator. In computer hard disk drives, phase modulators align data being read from the hard disk media to a sampling clock. When writing data to the hard disk media, phase modulators are often used to shift the phase of bit patterns on their way to the disk media.

Precision and linearity are factors frequently considered in phase modulator design. Precision, as used herein, refers to the ability of the phase modulator to repeatedly reproduce the desired amount of shift. Linearity refers to the ability of the phase modulator to produce a phase shift that is proportional to a control signal. Precision and linearity are particularly important in high performance phase modulators. For example, to test the precision and linearity of phase modulators used in modern high performance disk drives, a resolution of 10 picoseconds or less is desirable.

Conventional techniques for measuring the performance of phase modulators use a simple time interval measurement scheme in which a phase shifted version of a reference clock signal is compared to the original version of the reference clock signal. FIG. 1 is a diagram illustrating such a conventional system.

Integrated circuit 100 includes a phase modulator 102, a frequency synthesizer 104, and logic and driver circuitry 106. Frequency synthesizer 104 generates a range of possible frequencies based on a reference clock signal 108. By varying the frequency of the signal output from frequency synthesizer 104, frequency synthesizer 104 may test phase modulator 102 over a range of frequencies Logic and driver circuitry 106 receives the phase shifted signal from phase modulator 102 and transmits it off integrated circuit 100, as output signal 107, to an external testing system (not shown). The external testing system compares output signal 107 with reference signal 108 to ensure that the phase difference between signals 106 and 107 is within acceptable tolerances of the expected phase shift from phase modulator 102. Typically, this comparison is made over a range of frequencies and over a range of phase shift amounts.

The above-discussed technique for testing a phase modulator becomes increasing less useful as the frequency of the signal being phase shifted increases. For example, at frequencies in the order of 100 MHz and above, testing resolutions of 10 picoseconds or less are desirable. Such small resolution times, however, are not easily resolvable with external testing circuitry that directly compares the output signals. In particular, test precision is degraded by phase noise introduced at frequency synthesizer 104, at logic and driver circuitry 106, and in transmitting the high frequency signals through cables to the external test circuitry. Additionally, the act of simultaneously measuring and comparing high frequency signals 107 and 108 requires complicated circuitry that may itself introduce phase noise.

Accordingly, there is a need in the art to be able to more accurately test phase modulators (e.g., chip mounted phase modulators) operating at high frequencies.

SUMMARY OF THE INVENTION

An object of the present invention is to accurately and cost effectively test the performance of a phase modulator over a wide range of frequencies.

One aspect of the present invention is a device comprising a phase modulator and a phase to duty-cycle converter. The phase to duty-cycle converter is arranged to receive a reference signal and a phase shifted version of the reference signal and to output a signal based on the reference signal and the phase shifted version of the reference signal, the output signal having a duty-cycle that is a function of a phase difference between the reference signal and the phase shifted version of the reference signal.

A second aspect of the present invention is an integrated circuit comprising a frequency synthesizer, a phase modulator connected to receive a first signal and for generating a second signal having the same frequency as the first signal but shifted in phase to the first signal, a phase to duty-cycle converter, and a lowpass filter. The phase to duty-cycle converter generates an output signal having a duty-cycle that is a function of the difference in phase between the first and second signals, and the lowpass filter converts the output of the phase to duty-cycle converter to a direct current signal having an amplitude proportional to the difference in phase between the first and second signals.

A third aspect of the present invention is a system for measuring the phase difference between two signals. The system comprises an integrated circuit and a digital volt meter. The integrated circuit includes a phase modulator receiving a reference signal and generating a phase shifted version of the reference signal and a phase to duty-cycle converter arranged to receive the reference signal and the phase shifted version of the reference signal, the phase to duty-cycle converter outputting a signal based on the reference signal and the phase shifted version of the reference signal, the output signal having a duty-cycle that is a function of a phase difference between the reference signal and the phase shifted version of the reference signal.

Yet another aspect of the present invention is a method for measuring the phase difference between two signals. The method includes shifting a phase of a first signal to form a second signal; generating a third signal having a duty-cycle that is a function of the phase difference between the first and second signals; low-pass filtering the third signal; measuring the amplitude of the low-pass filtered third signal; and calculating the phase difference between the first and second signals based on the measured amplitude.

Yet another aspect of the present invention is a system for measuring the phase shift introduced by a phase modulator used to perform write pre-compensation of a bit pattern to be written to a hard disk array. The system comprises a lowpass filter for low-pass filtering a first bit pattern comprising a non-phase modulated bit pattern representing a zero phase shift, a second bit pattern comprising a non-phase modulated bit pattern representing a 100% phase shift, and a third bit pattern comprising a phase modulated bit pattern that has the phase shift that is to be measured; and a digital volt meter for measuring and recording the voltage of the filtered first bit pattern as $V_{noshift}$, the voltage of the filtered second bit pattern as $V_{reference}$, and the voltage of the filtered third bit pattern as V.

Yet another aspect of the present invention is a method for calculating a phase shift of a target bit in a target bit pattern.

The method comprises measuring a first voltage, $V_{noshift}$, that corresponds to the direct current (DC) value of a first bit pattern comprising a non-phase modulated bit pattern representing a zero phase shift of the target bit; measuring a second voltage, $V_{noshift}$, that corresponds to the DC value of a second bit pattern comprising a non-phase modulated bit pattern representing a 100% phase shift of the target bit; measuring a third voltage, V, that corresponds to the DC value of a phase modulated version of the target bit pattern; and calculating the phase shift of the target bit as a percentage of a full bit shift as: $(V-V_{noshift})/V_{reference} \times 100$.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein like reference numerals represent similar parts of the present invention throughout the several views and wherein:

FIG. 3 is a block diagram of one embodiment of a system for testing the performance of a phase modulator;

FIG. 4 is a diagram illustrating the phase to duty-cycle conversion circuit used in the system shown FIG. 3;

DETAILED DESCRIPTION OF THE ILLUSTRATED EMBODIMENTS

Reference will now be made in detail to embodiments of the invention, examples of which are illustrated in the accompanying drawings Wherever possible, the same reference numbers will be used throughout the drawings to refer to the same or like parts.

In general, in accordance with a first aspect of the present invention, the performance of a phase modulator in an integrated circuit can be accurately tested using an on-chip testing circuit that converts two signals, including a phase shifted signal and a reference signal, into a measurement signal having a duty cycle that is a function of the phase difference between the two signals. The measurement signal may be further converted to a direct current (DC) value before being transmitted off chip to external testing circuitry. The external testing circuitry, by simply measuring the magnitude of the DC signal, determines the phase difference between the phase shifted signal and the reference signal.

Figure 1:
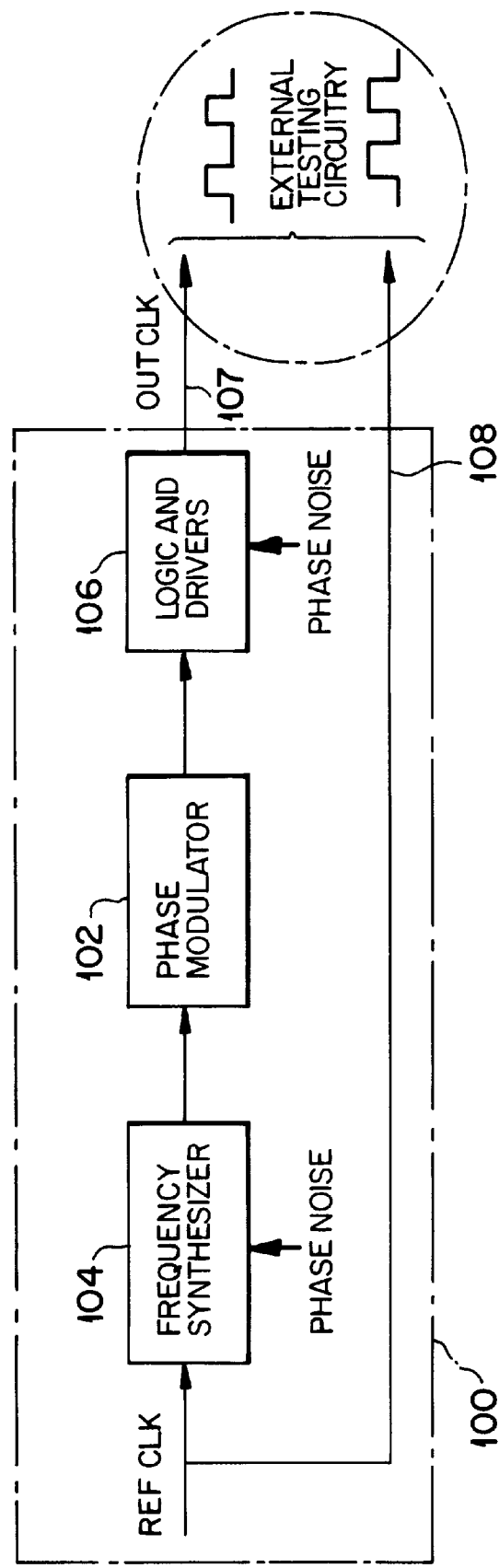
FIG. 1 is diagram illustrating a conventional system for testing the performance of a phase modulator.
Figure 2:
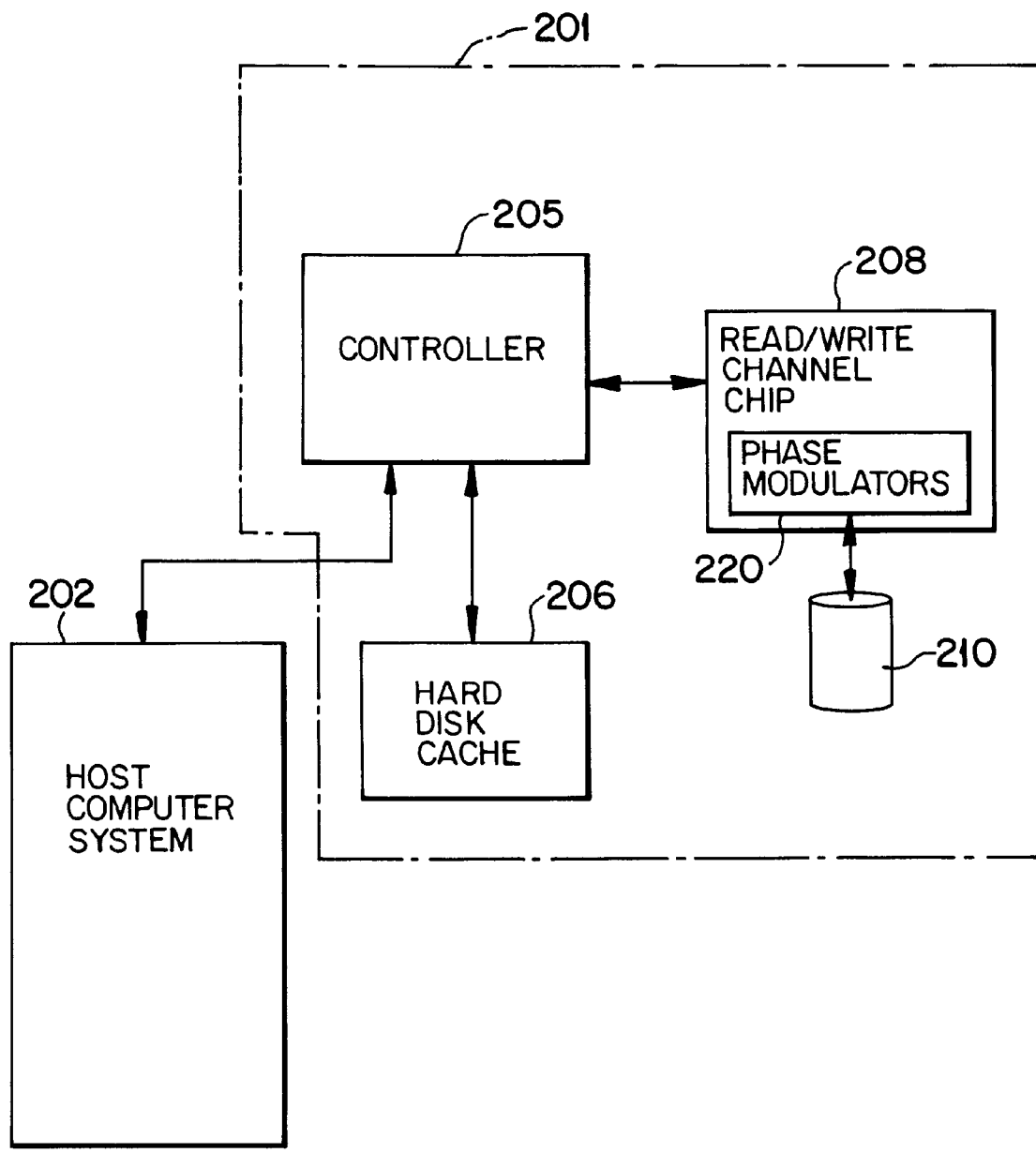
FIG. 2 is a block diagram illustrating a hard disk drive and its host computer system.

FIG. 2 is a block diagram illustrating a hard disk drive 201 and its host computer system 202. Hard disk drive 201 includes controller 205, hard disk cache 206, read/write channel chip 208, and hard disk array 210. Controller 205 performs high-level control of the disk drive. Controller 205, for example, coordinates communication with host computer system 202, on-board cache 206, and read/write channel chip 208. Read/write channel chip 208 converts signals from controller 205 to low-level signals able to be directly read from or written to hard disk array 210. During a read operation, read/write channel chip 208 formats the raw bit stream received from hard disk array 210 into a form appropriate for controller 205. Similarly, during a write operation, read/write channel chip 208 formats data from controller 205 into a bit stream useable by hard disk array 210.

Host computer 202 may be any of a number of well-known computer systems, such as personal computer systems, workstations, or portable laptop computer systems.

Read/write channel chip 208 uses phase modulators 220 to synchronize data coming from or going to hard disk array 210. In order to ensure the accuracy and linearity of phase modulators 220, phase modulators 220 are tested, typically as the hard disk or the read/write chip is being manufactured, to verify that they perform within tolerance levels over their range of intended frequency use.

Certain method and system embodiments of the present invention, for testing phase modulators on an integrated circuit, such as phase modulators 220, will now be described with reference to FIGS. 3–5.

FIG. 3 is a block diagram of one embodiment of a phase modulator testing circuit. Phase modulator testing circuit 300 may be implemented as part of a hard disk drive's read/write channel chip, such as read/write channel chip 208.

Phase modulator testing circuit 300 includes a frequency synthesizer 301, phase modulator 303, phase to duty-cycle converter circuit 305, and low-pass filter 307, all arranged on an integrated circuit 309. Frequency synthesizer 301 receives reference clock signal 311, and based on this clock signal, outputs the test signal, labeled "X", that is to be phase modulated. The phase modulated version of the test signal, after being shifted by phase modulator 307, is labeled "Y". Signals X and Y enter phase to duty-cycle converter circuit 305, which converts the relative phase difference between signals X and Y to a signal having a duty cycle that varies with the phase difference between signals X and Y. Lowpass filter 307 then low-pass filters the signal output from phase to duty-cycle converter 305 to substantially remove the alternating current component of the signal. The resultant signal is a simple direct current (DC) signal, which may be accurately transmitted off of chip 309 and measured externally by volt meter 310.

Because lowpass filters are well known in the art, a detailed description of the implementation of lowpass filter 307 will not be described herein. Additionally, although lowpass filter 307 is illustrated as being implemented on chip 309, lowpass filter 307 may alternatively be implemented off of chip 307, such as at a signal output pin of chip 307.

FIG. 4 is a schematic diagram showing the illustrated phase to duty-cycle converter circuit 305 in more detail. The reference clock signal X is reduced by frequency divider 401. The resultant signal, labeled Qr, is input to D flip-flop 403 and OR gate 405. The phase modified signal Y is used to clock the flip-flop 403. The output signal from flip-flop 403, signal Qp, is the second input to OR gate 405. Qr and Qp are logically ORed by gate 405 to produce an output, labeled Z, whose duty cycle is related to the phase difference between Qr and Qp.

Although frequency divider 401 is shown dividing the frequency of signal X by a factor of four, other frequency division factors (such as eight) may alternatively be used. Frequency divider 401 will be described herein as generating a reference signal ¼ of its input frequency.

Frequency divider 401 limits the range of the duty cycle of output signal Z to between 50% and 75%, where a 50% duty cycle corresponds to no phase shift (or, equivalently, a 2π phase shift) and a 75% duty cycle corresponds to a shift of π radians (180°). More particularly, the relationship between the duty cycle of output signal Z and the phase shift is:

$$\text{phase shift (radians)} = (\text{DutyCycle} - 0.5)(4\pi), \quad (1)$$

where DutyCycle is between 0.5 and 0.75, inclusive. The relationship of equation (1) would, of course, vary if a frequency divider having other than a division factor of ¼ were used.

Figure 5:
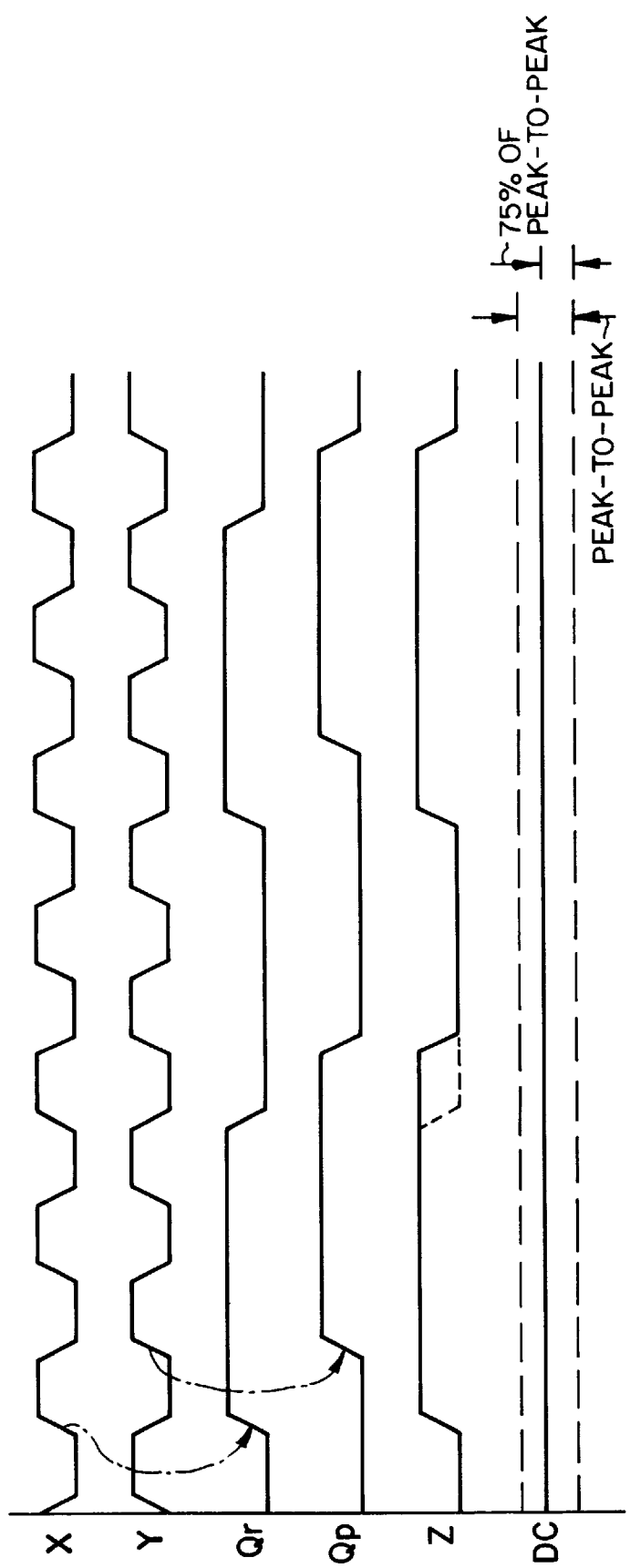
FIG. 5 is a timing diagram illustrating relative timing relationships of signals in the system of FIGS. 3 and 4.

FIG. 5 is a timing diagram illustrating the relative timing relationships of the signals in FIGS. 3 and 4. As shown, signals X and Y are 180° out of phase with one another. Signal Qr is a "stretched" version of signal X, having a period four times that of signal X. Flip-flop 403 generates signal Qp by outputting the value of signal Qr whenever signal Y transitions from a low to high state. As previously discussed, signal Z is the logical OR of signals Qr and Qp, and has a duty cycle related to the phase difference between X and Y. Filtering signal Z through lowpass filter 307 reduces signal Z to a simple DC signal, labeled "DC," which has a magnitude proportional to the duty cycle of signal Z. For example, as shown in FIG. 5, the magnitude of the DC signal is 75% of the peak value of signal Z. This corresponds to the 75% duty-cycle of signal Z, or alternatively, by applying equation (1), above, to a shift of π radians.

The DC signal output from low pass filter 307 may be transmitted off of IC chip 309 to external digital volt meter (DVM) 310. The voltage measured by meter 310 can be simply and automatically converted to the measured phase difference between signals X and Y. In particular, as discussed above, the DC voltage divided by the peak voltage of signal Z equals the duty-cycle of signal Z, which may be converted to the phase difference using equation (1).

Phase modulators 220 in read/write channel chip 208, in addition to shifting a reference clock signal, may also be used to shift pre-defined bit patterns by a certain amount. More particularly, when writing data to hard disk array 210, certain input bits in a bit pattern may be shifted at their falling (or alternatively, at their rising) transitions to pre-compensate the patterns for known requirements of the write head in hard disk array 210. This technique, which is known in the art, is called write pre-compensation for non-linear transition shifts.

Figure 6:
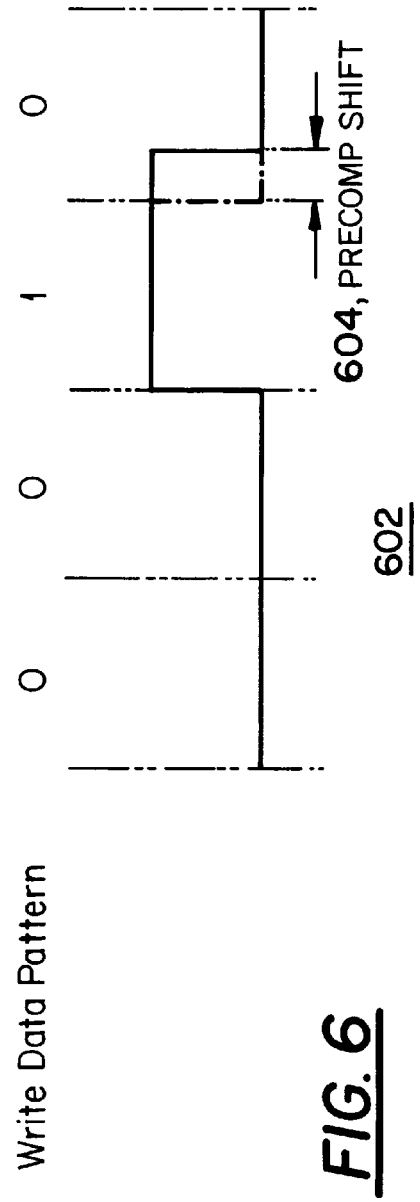
FIG. 6 illustrates a four-bit data pattern that is to be pre-compensated by a read/write channel chip.

FIG. 6 illustrates an exemplary four bit data pattern 602 that is to be pre-compensated by read/write channel chip 208. The binary data pattern illustrated in FIG. 6 is "0010." Whenever read/write channel chip 208 receives this pattern, it shifts the falling transition of the third bit of the pattern (the binary 1), a predetermined pre-compensation shift amount 604. Pre-compensation of the bit pattern assists the write head in hard disk array 210 in writing the bit patterns. During manufacture and/or assembly of the hard disk drives or of read/write chip 208, it may be necessary to test the shift amount 604 to ensure that phase modulators 220 are accurately shifting the bit pattern.

Figure 7:
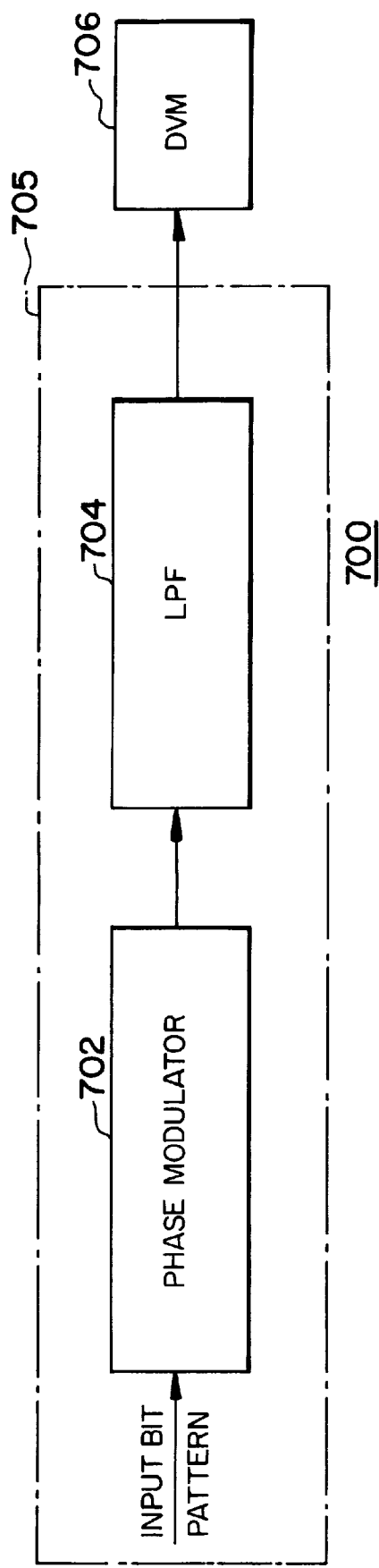
FIG. 7 is a block diagram of another embodiment of a system for testing the performance of a phase modulator.

FIG. 7 is a block diagram of another embodiment of a phase modulator testing circuit 700. Phase modulator 702 receives input bit patterns, such as four-bit bit pattern 602, and shifts one or more of the bits in the bit pattern by a predetermined amount. The shifted bit pattern is then lowpass filtered by lowpass filter 704. The resultant DC signal may be transmitted off of IC chip 705 and measured by digital volt meter 706. Alternatively, lowpass filter 704 may be implemented externally of chip 704, such as at the pins of IC chip 705.

Figure 8:
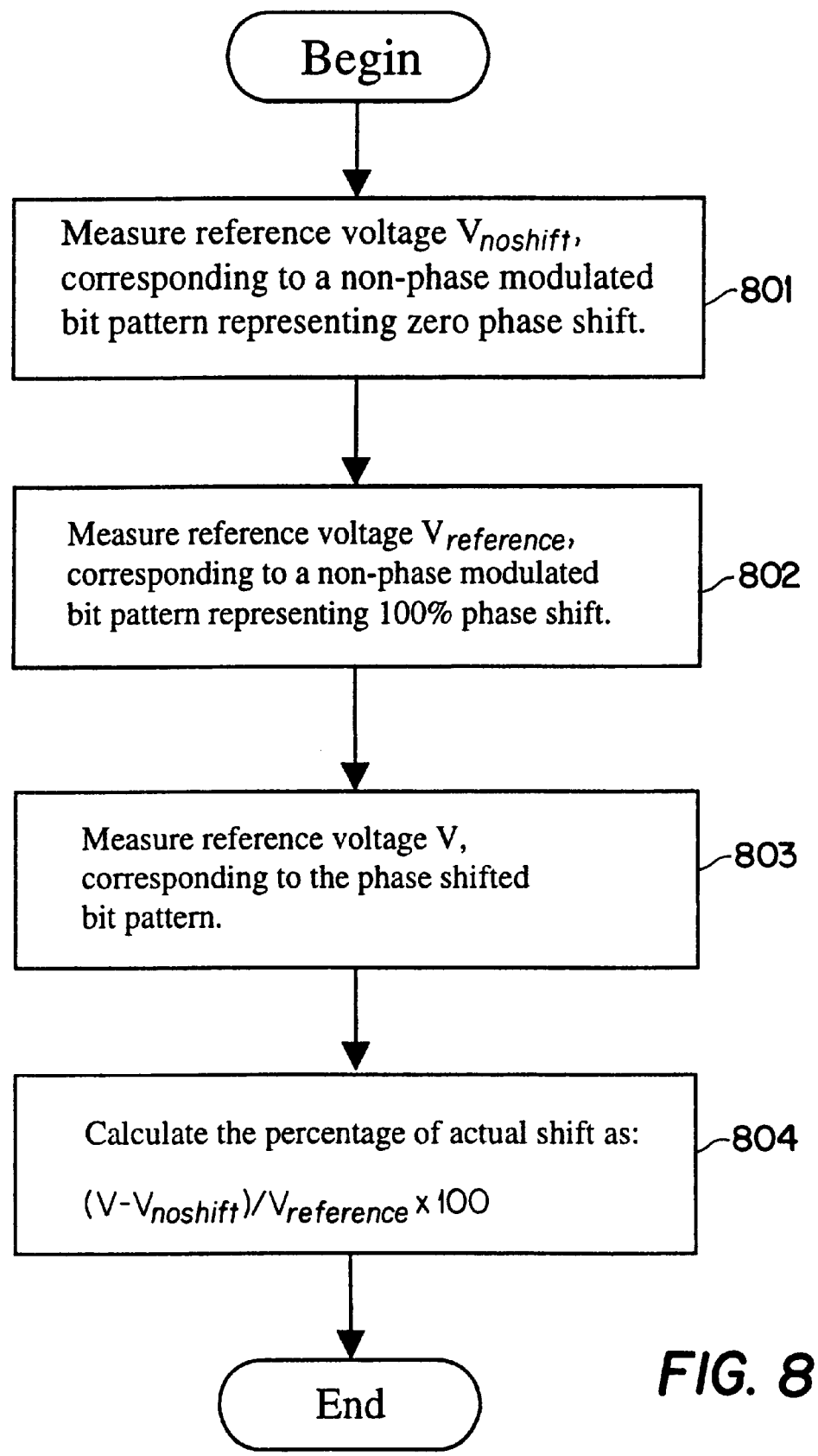
FIG. 8 is a flow chart illustrating methods used in operating the system of FIG. 7.
Figure 9A:
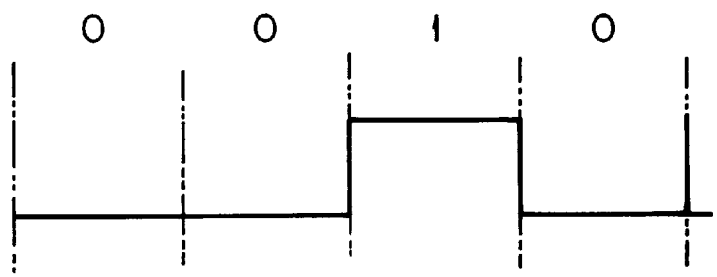
FIGS. 9A and 9B illustrate reference bit patterns used in calibrating the system shown in FIG. 7.
Figure 9B:
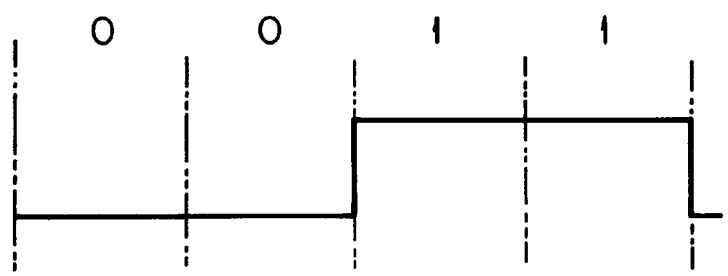

FIG. 8 is a flow chart of an illustrative method for operating circuit 700 in measuring the amount of shift introduced into bit pattern 604 by phase modulator 702. To begin, a reference pattern, such as the pattern "0010" (illustrated in FIG. 9A), which has not been phase shifted by phase modulator 702, is generated and passed through lowpass filter 704, (act 801), to produce voltage $V_{noshift}$ at voltage meter 706. This reference pattern corresponds to a version of bit pattern 604 with zero shift. A second reference pattern, representing a 100% pre-compensation shift of bit pattern 604, is passed through lowpass filter 704. (Act 802). FIG. 9B illustrates the second reference pattern for bit pattern 604, which, as shown, is simply the bit pattern "0011." The voltage produced at volt meter 706 by this pattern is called $V_{reference}$. Finally, the bit pattern to be write pre-compensated (e.g., pattern 604), is shifted by phase modulator 702 and then passed through lowpass filter 704. (Act 803). Voltage meter 706 measures the resultant voltage, V.

The percentage of pre-compensation applied by modulator 702 (i.e., the amount of shift applied to the target bit of bit pattern 604 as a percentage of a whole bit width) is calculated by the system, in act 804, using the following function of V, $V_{reference}$ and $V_{noshift}$:

$$(V - V_{noshift})/V_{reference} \times 100. \quad (2)$$

As described above, the precision and linearity of a phase modulator can be accurately and efficiently measured.

While the invention has been described by way of exemplary embodiments, it is understood that the words used herein are words of description, rather than words of limitation. Changes may be made, within the purview of the appended claims, without departing from the scope and the spirit of the invention in its broader aspects. Although the invention has been described herein with reference to particular structures, materials, methods, and embodiments, it is understood that the invention is not limited to the particulars disclosed. The invention extends to all equivalent structures, act, mechanisms, and uses.

What is claimed:

1. A device for testing a phase modulator, wherein said phase modulator receives a reference signal and outputs a phase-shifted version of the reference signal, comprising:
    a phase to duty-cycle converter arranged to receive the reference signal and the phase shifted version of the reference signal output by said phase modulator, the phase to duty-cycle converter outputting an output signal based on the reference signal and the phase shifted version of the reference signal, the output signal having a duty-cycle that is a function of a phase difference between the reference signal and the phase shifted version of the reference signal,
    wherein the phase-to duty-cycle converter further comprises:
        a frequency divider for reducing the frequency of the reference signal by a predetermined factor;
        a D type flip-flop having an input connected to the output of the frequency divider and a clock input connected to the phase shifted version of the reference signal; and
        an OR gate arranged to perform a logical OR operation on signals output from the frequency divider and the D type flip-flop.

2. The device of claim 1, wherein the frequency divider is a divide-by-four frequency divider.

3. The device of claim 1, wherein the device is implemented on a single intergrated circuit chip.

4. The device of claim 1, further including a lowpass filter connected to receive the signal output from the phase to duty-cycle converter.

5. The device of claim 4, wherein the lowpass filter is implemented on a single silicon chip with the phase modulator and the phase to duty cycle converter.

6. The device of claim 4, wherein the lowpass filter is implemented externally to a silicon chip in which the phase modulator and the phase to duty cycle converter are implemented.

7. The device of claim 4, further including a digital voltage meter connected to the output of the lowpass filter.

8. The device of claim 3, wherein the integrated circuit chip is used in the read/write channel of a hard disk drive.

9. An intergrated circuit comprising:
- a frequency synthesizer for generating a first signal of a desired frequency;
- a phase modulator connected to receive the first signal and for generating a second signal having the same signal as the first signal but shifted in phase to the first signal;
- a phase to duty-cycle converter for receiving the first and second signals and for generating an output signal having a duty-cycle that is a function of the difference in phase between the first and second signals; and
- a lowpass filter for converting the output of the phase to duty-cycle converter to a direct current signal having an amplitude proportional to the difference in phase between first and second signals;
- wherein the phase to duty-cycle converter further comprises:
  - a frequency divider for reducing the frequency of the reference signal by a predetermined factor;
  - a D type flip-flop having an input connected to the output of the frequency divider and a clock input connected to the phase shifted version of the reference signal; and
  - an OR gate arranged to perform a logical OR operation on signals output from the frequency divider and the D type flip-flop.

10. The integrated circuit of claim 9, wherein the frequency divider is a divide-by-four frequency divider.

11. The device of claim 9, wherein the intergrated circuit chip is used in the read/write channel of a hard disk drive.

12. A system for measuring the phase difference between two signals comprising:
- an intergrated circuit including
  - a phase modulator receiving a reference signal and generating a phase shifted version of the reference signal; and
  - a phase to duty-cycle converter arranged to receive the reference signal and the phase shifted version of the reference signal, the phase to duty-cycle converter outputting a signal based on the reference signal and the phase shifted version of the reference signal, the output signal having a duty-cycle that is a function of a phase difference between the reference signal and the phase shifted version of the reference signal; and
- a digital volt meter for measuring the direct current (DC) voltage level of the output signal;
- wherein the phase difference between the reference signal and the phase shifted version of the reference signal is a function of the voltage level measured by the digital volt meter divided by a peak voltage of the output signal; and
- wherein the function relating the phase difference ("$\phi$") and the voltage level measured by the digital volt meter divided by the peak potential voltage of the ouput signal ("DutyCycle") is:

$$\phi = (\text{DutyCycle} - 0.5)(4\pi).$$

13. The system of claim 12, further including a lowpass filter receiving the output signal from the phase to duty-cycle converter and generating a direct current signal form input to the digital volt meter.

14. The system of claim 13, wherein the lowpass filter is arranged in the integrated circuit.

15. The system of claim 13, wherein the lowpass filter is arranged externally to the integrated circuit.

16. A system for measuring the phase difference between two signals comprising:
- an intergrated circuit including
  - a phase modulator receiving a reference signal and generating a phase shifted version of the reference signal; and
  - a phase to duty-cycle converter arranged to receive the reference signal and the phase shifted version of the reference signal, the phase to duty-cycle coverter outputting a signal based on the reference signal and the phase shifted version of the reference signal, the output signal having a duty-cycle that is a function of a phase difference between the reference signal and the phase shifted version of the reference signal; and
- a digital volt meter for measuring the direct current (DC) voltage level of the output signal;
- wherein the phase difference between the reference signal and the phase shifted version of the reference signal is a function of the voltage level measured by the digital volt meter divided by a peak voltage of the output signal; and
- wherein the phase to duty-cycle converter further comprises:
  - a frequency divider for reducing the frequency of the reference signal by a predetermined factor;
  - a D type flip-flop having an input connected to the output of the frequency divider and a clock input connected to the phase shifted version of the reference signal; and
  - an OR gate arranged to perform a logical OR operation on signals output from the frequency divider and the D type flip-flop.

17. The device of claim 16, wherein the frequency divider is a divide-by-four frequency divider.

18. A method for measuring the phase difference between two signals comprising:
- shifting a phase of a first signal to form a second signal;
- generating a third signal having a duty-cycle that is a function of the phase difference between the first and second signals;
- low-pass filtering the third signal;
- measuring the amplitude of the low-pass filtered third signal; and
- calculating the phase difference between the first and second signals based on the measured amplitude;
- wherein calculating the phase difference between the first and second signals further includes dividing the measured amplitude by a peak voltage level of the third signal to obtain a first quantity, subtracting 0.5 from the first quantity to obtain a second quantity, and multiplying the second quantity by $4\pi$.

19. A system for measuring the phase shift introduced by a phase modulator used to perform write pre-compensation of a bit pattern to be written to a hard disk array, the system comprising:

- a lowpass filter for low-pass filtering to direct current (DC) signals a first bit pattern comprising a non-phase modulated bit pattern representing a zero phase shift, a second bit pattern comprising a non-phase modulated bit pattern representing a 100% phase shift, and a third bit pattern comprising a phase modulated bit pattern that has the phase shift that is to be measured; and
- a digital volt meter for measuring and recording the voltage of the filtered first bit pattern as $V_{noshift}$, the voltage of the filtered second bit pattern as $V_{reference}$, and the voltage of the filtered third bit pattern as V;
- wherein the measured phase shift of the third bit pattern as a percentage shift between the first and second signals is calculated according to the formula $(V-V_{noshift})/V_{reference} \times 100$.

20. The system of claim 19, wherein the lowpass filter is contained in an integrated circuit with the phase modulator.

21. A method for calculating a phase shift of a target bit in a target bit pattern comprising:

- measuring a first voltage, $V_{noshift}$, that corresponds to the direct current (DC) value of a first bit pattern comprising a non-phase modulated bit pattern representing a zero phase shift of the target bit;
- measuring a second voltage, $V_{reference}$, that corresponds to the DC value of a second bit pattern comprising a non-phase modulated bit pattern representing a 100% phase shift of the target bit;
- measuring a third voltage, V, that corresponds to the DC value of a phase modulated version of the target bit pattern; and
- calculating the phase shift of the target bit as a percentage of a full bit shift as: $(V-V_{noshift})/V_{reference} \times 100$.

* * * * *